United States Patent
Horng et al.

[11] Patent Number: 5,754,601
[45] Date of Patent: May 19, 1998

[54] JITTER CIRCUIT FOR REDUCED SWITCHING NOISE

[75] Inventors: Bor-Rong Horng, Mission Viejo; Daryush Shamlou, Laguna Nigual, both of Calif.

[73] Assignee: Rockwell International Corporation, Newport Beach, Calif.

[21] Appl. No.: 644,762

[22] Filed: May 10, 1996

[51] Int. Cl.$^6$ ............................................ H04B 1/10
[52] U.S. Cl. ............................................ 375/350; 329/320
[58] Field of Search ............................................ 375/350, 316; 329/320, 304

[56] References Cited

U.S. PATENT DOCUMENTS

| | | | |
|---|---|---|---|
| 4,910,468 | 3/1990 | Ohtsuka et al. | 329/316 |
| 4,910,469 | 3/1990 | Takahashi | 329/320 |
| 4,910,752 | 3/1990 | Yester, Jr. et al. | 375/75 |
| 5,023,940 | 6/1991 | Johnson et al. | 455/212 |
| 5,367,540 | 11/1994 | Kakushi et al. | 375/103 |
| 5,440,587 | 8/1995 | Ishikawa et al. | 375/332 |
| 5,493,721 | 2/1996 | Reis | 455/339 |
| 5,500,874 | 3/1996 | Terrell | 375/232 |
| 5,619,536 | 4/1997 | Gourgue | 375/316 |

*Primary Examiner*—Stephen Chin
*Assistant Examiner*—Mohammad Ghayour
*Attorney, Agent, or Firm*—William C. Cray; Philip K. Yu

[57] ABSTRACT

A circuit for reducing switching noise caused by harmonics of an output coupled to a band of interest in a mixed signal communication device, with the mixed signal communication device having a predetermined sampling clock. The circuit comprises a bandpass delta-sigma modulator for receiving an input centered at intermediate frequency ("IF") to generate a digital output. In-phase and Quadrature-phase digital mixers for mixing the digital output from the bandpass delta-sigma modulator down to baseband digital signals, first and second digital integrators coupled to the digital mixers for integrating the baseband digital signals to generate integration outputs, first and second decimation latches coupled to the digital integrators for generating latched integration output, a programmable counter for generating jitter sampling clocks based on the predetermined sampling clock, where the jitter sampling clock has a fixed average sampling rate, first and second FIR engines coupled to the decimation latches for differentiating, low-pass filtering and droop-correcting the latched integration outputs, using the jitter sampling clocks to generate first and second filtered digital outputs.

10 Claims, 2 Drawing Sheets

JITTER CIRCUIT FOR REDUCED SWITCHING NOISE

FIELD OF THE INVENTION

The present invention relates to mixed signal communication electronic devices and more particularly to the mixed signal devices using analog-to-digital converters and finite impulse-response (FIR) engines.

ART BACKGROUND

In mixed signal communication systems, such as the GSM ("GSM System of Mobile communication") baseband transceiver coder/decoders (CODEC), it is quite common for a digital filter to generate switching noise at the output sample rate. For a mixed signal integrated circuit ("IC"), the noise from the digital side causes a large current to be sent to the sensitive analog side through the substrate of the IC. Such switching noise and its associated harmonics, if they happened to be coupled to a "band of interest," can significantly degrade the performance of the communication system.

Although there are ways to get around the noise problems, they typically involve modifying the overall frequency scheme of the system design. For GSM-compliant applications, the constraint on the available frequency for the system design, however, will preclude such modification of the frequency scheme.

Therefore, it is desirable to have a mixed signal communication system with reduced impact from the noise and its associated harmonics.

It is also desirable to be able to reduce the impact of the noise and its associated harmonics, while complying with the preferred overall frequency scheme from the system designing considerations.

SUMMARY OF THE INVENTION

A circuit for reducing switching noise caused by harmonics of an output coupled to a band of interest in a mixed signal communication device, said mixed signal communication device having a predetermined sampling clock. The circuit comprises a bandpass delta-sigma modulator for receiving an input centered at intermediate frequency ("IF") to generate a digital output, In-phase and Quadrature-phase digital mixers for mixing the digital output from the bandpass delta-sigma modulator down to baseband digital signals, first and second digital integrators coupled to the digital mixers for integrating the baseband digital signals to generate integration outputs, first and second decimation latches coupled to the digital integrators for generating latched integration output, a programmable counter for generating jitter sampling clocks based on the predetermined sampling clock, where the jitter sampling clock has a fixed average sampling rate, first and second FIR engines coupled to the decimation latches for differentiating, low-pass filtering and droop-correcting the latched integration outputs, using the jitter sampling clocks to generate first and second filtered digital outputs.

BRIEF DESCRIPTION OF THE DRAWINGS

Additional objects, features and advantages of the present invention will become apparent from the detailed description that follows, wherein.

DETAILED DESCRIPTION OF THE PREFERRED EMBODIMENT

Figure 1:
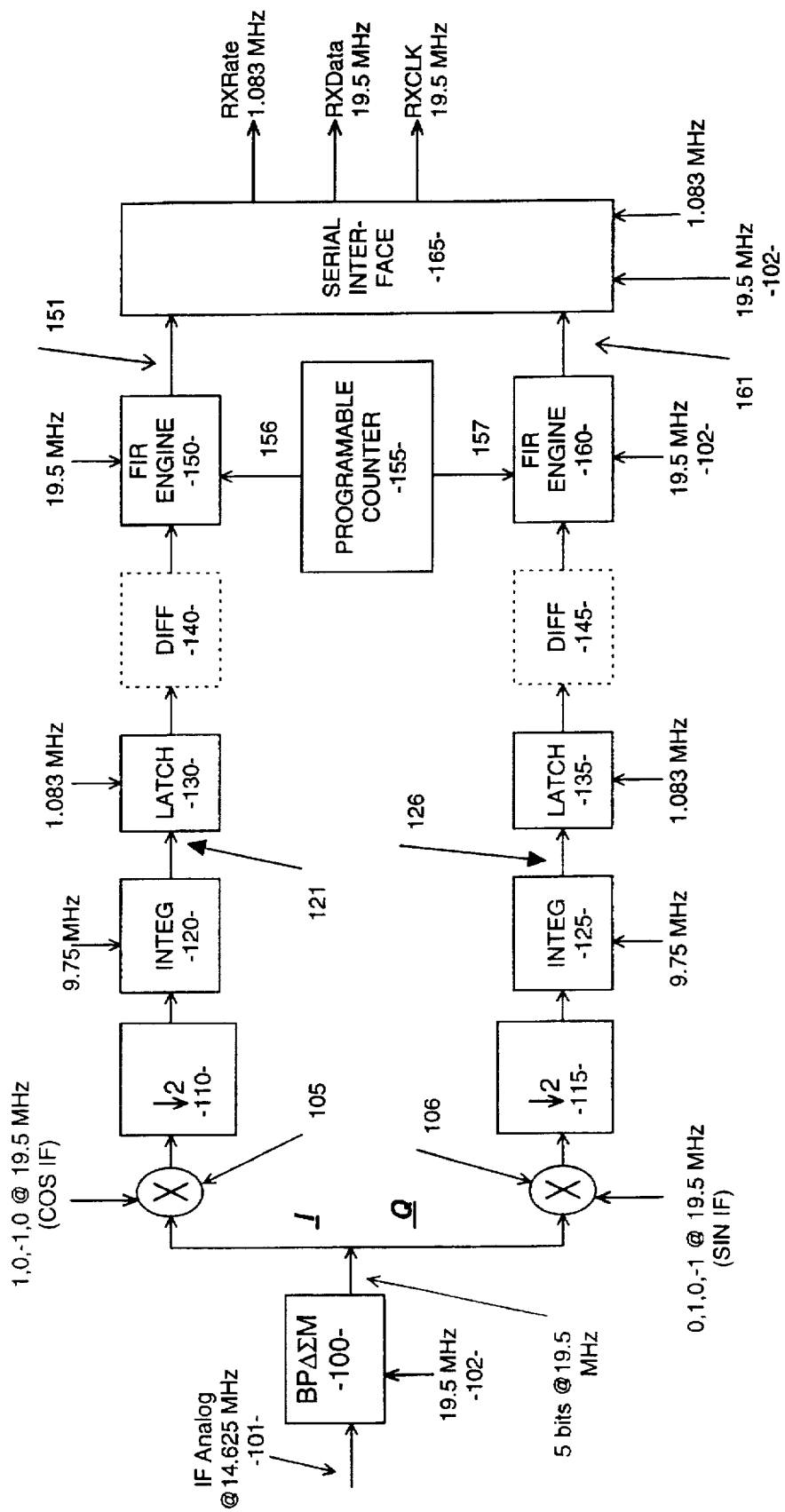
FIG. 1 is a system diagram illustrating the modulator and digital filter system 10 in accordance with the present invention.

FIG. 1 is a diagram illustrating the modulator and digital filter system 10 in accordance with the present invention. In the following description, numerous specific details, such as the frequencies of the various clocks and signals, are set forth in order to provide a thorough understanding of the present invention. It should be understood, however, by those skilled in the art that these details are not required to practice the present invention. In other instances, well known circuits, methods and the like are not set forth in detail to avoid unnecessarily obscuring the present invention.

Reference is to the system 10 in FIG. 1. The output of a bandpass delta-sigma modulator 100 ("BPDSM") is connected two channels of the filtering units, for both In-phase and Quadrature-phase ("I channel and Q channel," respectively). For each channel, the filtering unit of the system 10 has a mixer 105, 106, a decimator 110, 115, an integrator 120, 125, a latch 130, 135, an FIR ("finite impulse response") engine 150, 160 and a serial output interface 165 for outputting serial signals such as RXRate, RXData and RXClock. A programmable counter 155 applies a jitter sampling clock to each of the FIR engines 150, 160.

The operation of the modulator and digital filter system 10 in accordance with the present invention is now described with respect to the I channel. An analog IF signal 101, which may be centered at a frequency of 14.625 MHz, is first received by the BPDSM 100. Such IF signal may be the converted-down signal from an RF stage (not shown) of the handset, where the system 10 in accordance with the present invention may be implemented. With a 19.5 MHz modulating signal 102, the BPDSM 100 can generate a modulated 5-bit digital signal with a frequency of 19.5 MHz.

The digital signal is applied to both I and Q channels of the filtering unit of the system 10. In the I channel, the signal is mixed with an IF signal, e.g. a cosine signal, by a digital mixer 105 down to a baseband signal, which is applied to an integrator 120 to generate an integration output signal 121. The integration output signal 121 is latched by a decimation latch 110 and 130.

The latched integration output signal is then applied to the FIR engine 150 for differentiation, low-pass filtering and "droop-correction". With a programmable counter 155 supplying a jitter sampling clock 156 based on a given sampling clock rate, a filtered digital output 151 can be generated. The filtered digital output can then be converted to serial data through a serial interface 165.

To provide the jitter sampling clock 156 in accordance with the present invention, one condition for the operation of the programmable counter 155 is that the jitter sampling clock must have a fixed effective average sampling rate. This fixed effective average sampling rate thus serves to spread the switching noise across frequencies around the sampling rate, but not at the "band of interest," and cause its harmonics to reduce the in-band switching noise.

For example, if data is sampled once every 36 clocks, then to reduce the in-band switching noise, the frequency at which data is sampled can be made variable such that data is first sampled once every 34 clocks, once every 37 clocks and then once every 37 clocks, resulting in an effective average sampling rate of 36 clocks. As an another example, data may be sampled in a combination of 34, 35, 37 and 38 clocks to maintain the effective average sampling rate of 36 clocks. It should be noted that as long as the computation is completed before the available clock cycles, data can be sampled in any combination of sampling rates thereafter to maintain the effective sampling rate.

The operation in the Q-channel is essentially the same except that the digital mixer 106 now mixes the digital signal from the BPDSM with a sine IF signal.

Figure 2:
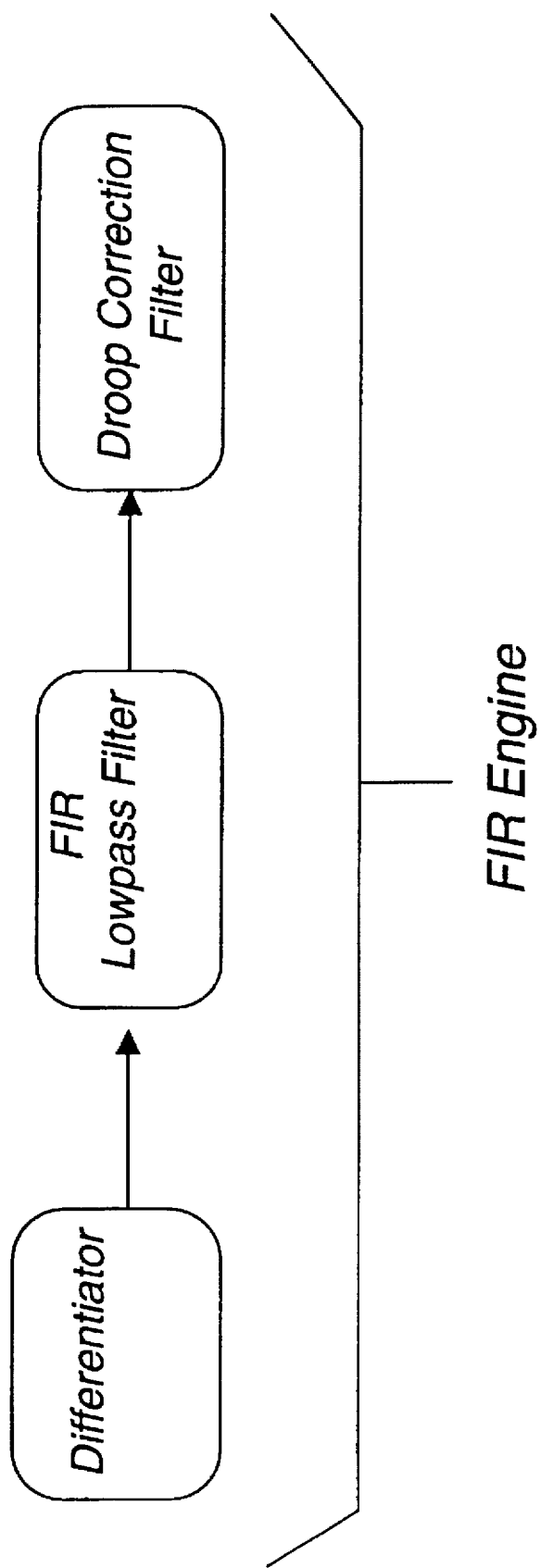
FIG. 2 illustrates the FIR engine in accordance with the present invention.

Reference is to FIG. 2, where the FIR engine in accordance with the present invention is further described. The FIR engine may be constructed with the following functionalities: differentiator, FIR low-pass filter, and droop correction filter. Also, as will be appreciated by those skilled in the art, the differentiator may be implemented prior to the FIR stage.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims. In the claims, means-plus-function clauses are intended to cover the structures described herein as performing the recited function and not only structural equivalents but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

We claim:

1. A circuit for reducing switching noise caused by harmonics of an output coupled to a band of interest in a mixed signal communication device, said mixed signal communication device having a predetermined sampling clock, said circuit comprising:

an analog signal processing means receiving an input centered at intermediate frequency ("IF") to generate a digital output;

a first ("In-Phase") digital mixer for mixing the digital output from the analog signal processing means down to a first baseband digital signal;

a first digital integrator coupled to the first digital mixer for integrating the first baseband digital signal to generate a first integration output;

a first decimation latch coupled to the first digital integrator for generating a latched first integration output;

a programmable counter for generating a first jitter sampling clock based on the predetermined sampling clock, the jitter sampling clock having a fixed average sampling rate;

a first FIR engine coupled to the first decimation latch for differentiating, low-pass filtering and droop-correcting the latched first integration output, using the jitter sampling clock to generate a first filtered digital output.

2. The circuit according to claim 1, wherein said analog signal processing means is a bandpass delta-sigma modulator.

3. A circuit according to claim 1, further comprising:

a second ("Quadrature Phase") digital mixer for mixing the digital output from the analog signal processing means down to a second baseband digital signal;

a second digital integrator coupled to the second digital mixer for integrating the second baseband digital signal to generate a second integration output;

a second decimation latch coupled to the second digital integrator for generating a latched second integration output;

a second FIR engine coupled to the second decimation latch for differentiating, low-pass filtering and droop-correcting the latched second integration output, using the jitter sampling clock to generate a second filtered digital output.

4. A circuit according to claim 2, further comprising:

a second ("Quadrature Phase") digital mixer for mixing the digital output from the analog signal processing means down to a second baseband digital signal;

a second digital integrator coupled to the second digital mixer for integrating the second baseband digital signal to generate a second integration output;

a second decimation latch coupled to the second digital integrator for latching the second integration output;

a second finite impulse response ("FIR") engine coupled to the second decimation latch for differentiating, low-pass filtering and droop-correcting the latched second integration output, using the jitter sampling clock to generate a second filtered digital output.

5. A circuit according to claim 3, further comprising:

a serial interface coupled to the first and second FIR digital engine for converting into serial data.

6. A circuit according to claim 4, further comprising:

a serial interface coupled to the first and second FIR digital engine for converting into serial data.

7. A circuit according to claim 5, wherein:

the FIR engine completes its task within a predetermined clock cycles and the jitter sampling clock has a sampling clock equal or greater than the predetermined clock cycles.

8. A circuit according to claim 6, wherein:

the FIR engine completes its task within a predetermined clock cycles and the jitter sampling clock has a sampling clock equal or greater than the predetermined clock cycles.

9. A circuit for reducing switching noise caused by harmonics of an output coupled to a band of interest in a mixed signal communication device, said mixed signal communication device having a predetermined sampling clock, said circuit comprising:

a bandpass delta-sigma modulator for receiving an input centered at intermediate frequency ("IF") to generate a digital output;

a first ("In-Phase") digital mixer for mixing the digital output from the bandpass delta-signal modulator down to a first baseband digital signal;

a first digital integrator coupled to the first digital mixer for integrating the first baseband digital signal to generate a first integration output;

a first decimation latch coupled to the first digital integrator for generating a latched first integration output;

a programmable counter for generating a first jitter sampling clock based on the predetermined sampling clock, the jitter sampling clock having a fixed average sampling rate;

a first FIR engine coupled to the first decimation latch for differentiating, low-pass filtering and droop-correcting the latched first integration output, using the jitter sampling clock to generate a first filtered digital output;

a second ("Quadrature Phase") digital mixer for mixing the digital output from the bandpass delta-sigma modulator down to a second baseband digital signal;

a second digital integrator coupled to the second digital mixer for integrating the second baseband digital signal to generate a second integration output;

a second decimation latch coupled to the second digital integrator for generating a latched second integration output;

a second FIR engine coupled to the second decimation latch for differentiating, low-pass filtering and droop-correcting the latched second integration output, using the jitter sampling clock to generate a second filtered digital output.

10. The circuit according to claim 9, further comprising a serial interface for converting said first and second filtered digital outputs into serial data.

* * * * *